US008433545B2

(12) United States Patent
Kropp et al.

(10) Patent No.: US 8,433,545 B2

(45) Date of Patent: Apr. 30, 2013

(54) COMPENSATION OF ELECTROMAGNETIC INTERFERING FIELDS

(75) Inventors: Peter Kropp, Mainz (DE); Subramanian Krishnamurthy, Randolf, MA (US)

(73) Assignee: Integrated Dynamics Engineering GmbH, Raunheim (DE)

( * ) Notice: Subject to any disclaimer, the term of this patent is extended or adjusted under 35 U.S.C. 154(b) by 28 days.

(21) Appl. No.: 12/814,754

(22) Filed: Jun. 14, 2010

(65) Prior Publication Data

US 2011/0144953 A1 Jun. 16, 2011

(30) Foreign Application Priority Data

Jun. 13, 2009 (DE) ......................... 10 2009 024 826

(51) Int. Cl.
*H03F 1/26* (2006.01)
*H01J 29/06* (2006.01)
*H01H 47/00* (2006.01)
*G01C 17/38* (2006.01)

(52) U.S. Cl.
USPC .................. 702/194; 315/8; 361/146; 33/356

(58) Field of Classification Search .................. 702/194, 702/57–59, 64–65, 81, 84–85, 104, 106, 702/127, 182–183, 189–191; 324/200, 202, 324/207.11–207.14, 244, 256–258, 260; 361/139, 143, 146, 152; 315/8; 33/355 R, 33/356
See application file for complete search history.

(56) References Cited

U.S. PATENT DOCUMENTS

| | | | | |
|---|---|---|---|---|
| 4,823,081 | A * | 4/1989 | Geisler | 324/225 |
| 7,436,120 | B2 * | 10/2008 | Buschbeck et al. | 315/8 |
| 2005/0195551 | A1 | 9/2005 | Buschbeck et al. | 361/143 |

FOREIGN PATENT DOCUMENTS

| | | |
|---|---|---|
| DE | 4217302 | 12/1992 |
| DE | 19702831 | 3/1998 |
| EP | 0379374 | 1/1990 |
| GB | 2411741 | 9/2005 |
| WO | WO2005/078467 | 8/2005 |

OTHER PUBLICATIONS

Reta-Hernandez et al., Attenuation of Low Frequency Magnetic Fields Using Active Shielding, 1998, Electric Power Systems Research 45, pp. 57-63.*

Pluska et al., Measurement of Magnetic Field Distorting the Electron Beam Direction in Scanning Electron Microscope, Jan. 2009, IEEE Transactions on Instrumentation and Measurement, vol. 58, No. 1, pp. 173-179.*

(Continued)

*Primary Examiner* — Toan Le

(74) *Attorney, Agent, or Firm* — Ohlandt, Greeley, Ruggiero & Perle, LLP.

(57) ABSTRACT

A system for compensating electromagnetic interfering fields is provided that includes two triaxial magnetic field sensors for outputting real sensor signals; six compensation coils, which are arranged as a cage around an object to be protected, and may individually be actuated; a control unit having six inputs, and six outputs, and a digital processor receiving the sensor signals on the input side, and processing the signals to control signals for the compensation coils. The real sensor signals are converted to virtual sensor signals by a first matrix multiplication for mapping the interfering fields at the location of the object. The virtual sensor signals are made to modified signals by an operator describing the controller structure. The modified signals are converted to real control signals by a second matrix multiplication, which control signals are individually fed to the six compensation coils.

2 Claims, 5 Drawing Sheets

OTHER PUBLICATIONS

Freedman et al., Large Volume Degausser with Gradient Compensation, Mar. 15, 1967, Journal of Applied Physics, vol. 38, No. 4, pp. 1856-1862.*

English Translation of Search Report corresponding to European Patent Application No. 10006132.4-1239 dated Oct. 21, 2010.

Office Action corresponding to German Patent Application No. 102009024826.9-32 dated Jan. 12, 2010.

English Translation of Office Action corresponding to German Patent Application No. 102009024826.9-32 dated Jan. 12, 2010.

Search Report corresponding to European Patent Application No. 10006132.4-1239 dated Oct. 21, 2010.

* cited by examiner

COMPENSATION OF ELECTROMAGNETIC INTERFERING FIELDS

CROSS REFERENCE TO RELATED APPLICATIONS

This application claims benefit under 35 U.S.C. §119(a) of German Patent Application No. 10 2009 024 826.9-32, filed Jun. 13, 2009, the entire contents of which are incorporated herein by reference.

BACKGROUND OF THE INVENTION

1. Field of the Invention

The invention relates generally to a system for compensating electromagnetic interfering fields, and in particular to a system for magnetic field compensation having two sensors and a digital processor.

2. Description of Related Art

For compensating electromagnetic interfering fields, in particular magnetic interfering fields, feedback control systems are used in the very most cases, whereby one, or more sensors measure the amplitude of the interfering field for all three Cartesian space axes. The measuring signals of the sensors are fed to a control loop, which calculates control, or actuator signals from the measuring signals of the sensors, for devices generating magnetic fields.

The magnetic field to be compensated may be the terrestrial magnetic field, or may be generated by other current-carrying devices being in the surrounding.

Magnetic field compensation systems are for example used in connection with imaging systems using magnetic fields, for example in the case of scanning electron microscopes (SEM).

In case of the mentioned devices for generating magnetic fields, it may be a matter of a current-carrying conductor, in the easiest case. Generally, one assumes interfering fields having far field characteristics, i.e. such fields, whose field amplitude does not essentially change within the range of 5 m. This assumption for example is true for interferences by rail vehicles. If the interfering fields are homogeneous in the range of interest, the compensation fields should be homogeneous, also.

Pairs of so-called Helmholtz coils are preferably used for generating homogeneous compensation fields. At this, it is about two coils each being connected in the same direction, and having a distance to each other being equal to the half length of the edge (=coil diameter) (so-called Helmholtz condition).

Furthermore, pairs of Helmholtz coils are used, whose distance to each other is equal to one length of the edge. If one pair of Helmholtz coils is used for each of the three space axes, the pairs of coils form a cube-shaped cage around the location, at which one, or more interfering fields shall be compensated. In case of such a coil arrangement, there indeed are field inhomogeneities in the interior of the cage, but these are acceptable in the most cases of application.

A device for compensating magnetic fields is disclosed in U.S. Publication No 2005/019555A1 and has three coil pairs in a cage. The magnetic field to be compensated is measured and compensated, where an analog controller is used.

Systems are also available, with which only one coil per space axis is used for generating the compensation field, however the compensation region, i.e. the region in which a good compensation is achieved, is considerably smaller than in the case of Helmholtz coils.

Generally, one single magnetic field sensor is used for measuring the magnetic field at the place of interest. As an exception, there is a second sensor which is, however, used for diagnosis purposes. A single magnetic field sensor does not allow to detect, whether the magnetic field to be compensated is homogeneous, or inhomogeneous at the location of the object to be protected.

It is a further problem when compensating electromagnetic interfering fields that it cannot be measured directly at the location at which the interfering field is to be compensated, since the object to be protected against interfering fields generally is at this location.

A further problem arises, if two magnetic field compensation systems are arranged directly adjacent to one another. Then, undesired feedback effects may occur between the two systems.

There are problems with the control systems in that these control systems can generally be optimized to single application. An adjustment to control tasks that are quite different, such as upon changes in the control configuration, is as a rule not possible or only in a restricted manner possible and/or is to be implemented with great difficulties. Furthermore non-linear control systems which may have a better interference field compensation than linear control systems, generally can only be implemented with high costs. When control circumstances change, the whole control circuit or the control loop would have to be newly calculated, designed and/or changed. In most cases, the direct user is not a position to do so.

SUMMARY OF THE INVENTION

Therefore, it is an object of the invention to provide a system for compensating electromagnetic interfering fields with which system homogeneous as well as inhomogeneous magnetic fields may be compensated.

It is a further object of the invention to perform a simulation of measuring electromagnetic interfering fields at the location of the object to be protected.

It is a still further object of the invention to equalize potentially arising feedback effects in the case of using two magnetic field compensation systems in immediate vicinity.

In detail, a system for compensating electromagnetic interfering fields is provided, which has two real triaxial magnetic field sensors, three pairs of compensation coils, and one control unit in order to protect an object against influences of an interfering field. It is preferred to design the control unit as a control processor such as a Digital Signal Processor DSP or a field programmable gate array FPGA.

The six in total output signals of the two real sensors may be combined to three output signals of a virtual sensor, by means of a freely definable kind of averaging. By choosing the averaging algorithm properly, it can be achieved that the output signals of the virtual sensor represent the amplitude of the interfering field at the location of the object to be protected.

The averaging takes place by means of the control system, which receives the six output signals of the two real magnetic field sensors via six inputs.

For every sensor, the output signals of the two magnetic field sensors may be represented by a three-dimensional vector. These two vectors may be combined to six-dimensional vector, i.e. a 6×1 matrix. The averaging over the output signals of the two real sensors, i.e. calculating the output signals of the virtual sensor, may be described by a matrix multiplication:

$$V=M\cdot S$$

V: 6×1 matrix of the output signals of the virtual sensor;

M: 6×6 matrix describing the averaging over the output signals of the real sensors; and S: 6×1 matrix of the output signals of the virtual sensor.

The now available output signals (=virtual input signals of the control system) of the virtual sensor are used as an input for independent control loops operating in parallel. These control loops may be broadband, selective concerning a frequency range, or selective concerning a frequency, also. The control loops have control algorithms transforming the virtual input signals V into changed signals $\hat{V}$. At this, $\hat{V}$ is a 6×1 matrix representing the in total six changed input signals of the control system. The control algorithm is described by an operator Ω. There are no limitations concerning the control algorithm being used. Accordingly, the operator Ω may not be a matrix so that nonlinear algorithms may also be used. Therefore, the transition to the modified signals $\hat{V}$ is described by $$\hat{V}=\Omega(V)$$

The matrix $\hat{V}$ is multiplied by a 6×6 matrix L, in order to obtain control signals for the six coils, i.e.

$$O=L\cdot\hat{V}$$

with:

L: 6×6 matrix for calculating the control signals O from the modified signals $O=L\cdot\hat{V}$.

Therefore, the algorithm used by the control system may overall be described as follows:

$$O=L\cdot\Omega(M\cdot S)$$

The more inhomogeneous the compensation field is in case of homogeneous interference, and the more homogeneous the compensation field is in case of inhomogeneous interference, the smaller is the region around the feedback sensor having a good compensation effect.

If the interference field is inhomogeneous, it is not purposeful to generate a homogeneous compensation field. In this case, it is also purposeful to use a single actuator coil instead of a pair of Helmholtz coils.

Only a single compensation system is used in this case, i.e. only three virtual signals are used for processing virtual sensor positions, and for generating gradient fields so that M may be a 3×6 matrix, and L may be a 6×3 matrix. Alternatively, the "not used" elements of the 6×6 matrices may also be equal to zero.

In case of a Helmholtz coil arrangement, only one coil of the pair is actively actuated, and that depending on the gradient of the interfering field below the compensation region, or above the compensation region. Therefore, a rearrangement for changing the position of the single coil is not necessary besides a new parametrisation of the control loops, in case of a change of the structure of the interfering field.

If two compensation systems are operated directly beside each other, this results in mutual interferences. The feedback between the two systems my be described by means of a 6×6 feedback, or crosscoupling matrix C. C represents the feedback of a control signal $O_i$ with a virtual signal $V_i$.

For avoiding interferences, the feedback system will not deliver optimal results. As a rule, an overcompensation, or an under compensation is only feasible for digital control systems, and also in this case for systems not operating in broadband. The position of the sensor would have to be fitted for all other systems. Such a change of position may it make it necessary that the sensors for the three space axes have to be positioned at different positions in space. But because one single system for all kinds of applications is not aimed for, overcompensation or undercompensation respectively is not an appropriate method.

When doing so, the matrix S of the output signals of the real sensors is enlarged to a 6×1 matrix $\hat{S}$. Therefore, it is true over all:

$$O=L\cdot\Omega(M\cdot(S-C\cdot O))$$

DETAILED DESCRIPTION OF THE INVENTION

In the following, the invention is described in more detail referring to the attached figures by means of exemplary embodiments, wherein same reference signs refer to same components.

Figure 1:
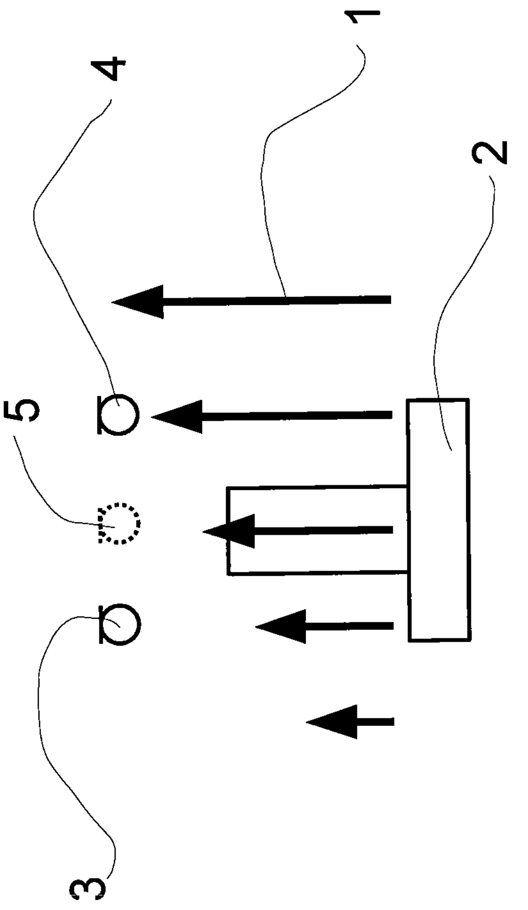
FIG. 1 shows a schematic presentation of the system for compensating an inhomogeneous interfering field.

FIG. 1 schematically shows the system for compensating electromagnetic interfering fields. An object 2 to be protected against effects of the interfering field 1 is permeated by the interfering field 1. Here, the interfering field 1 is assumed to be a gradient field.

Figure 2:
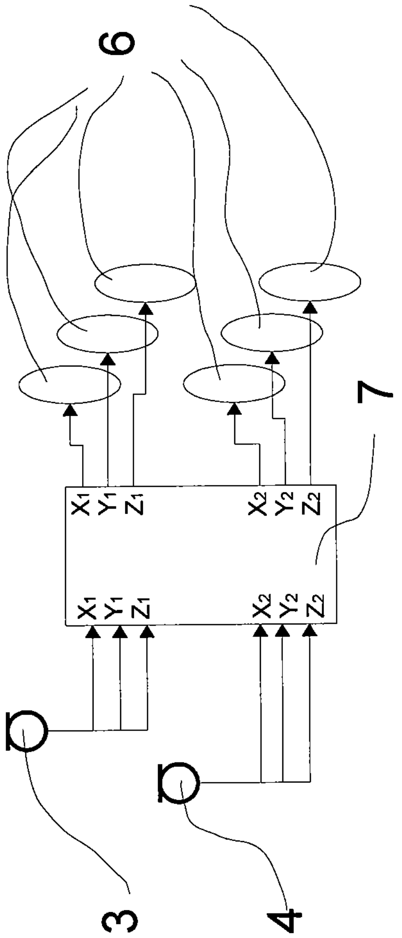
FIG. 2 is a schematic presentation of the system for compensating electromagnetic interfering fields, together with its control system.

The amplitude of the interfering field 1 is measured by two real magnetic field sensors 3, and 4. The first real sensor 3 provides an output signal $\vec{S}_1=[x_1(t), y_1(t), z_1(t)]$, and the second real sensor 4 provides an output signal $\vec{S}_2=[x_2(t), y_2(t), z_2(t)]$. These two output signals are fed in a digitised form to the control unit 7 shown in FIG. 2.

The control unit 7 has six inputs for the six signals in total, corresponding to 2×3 space axes. Furthermore, the control unit 7 has six outputs for outputting control signals for six coils 6.

Figure 3:
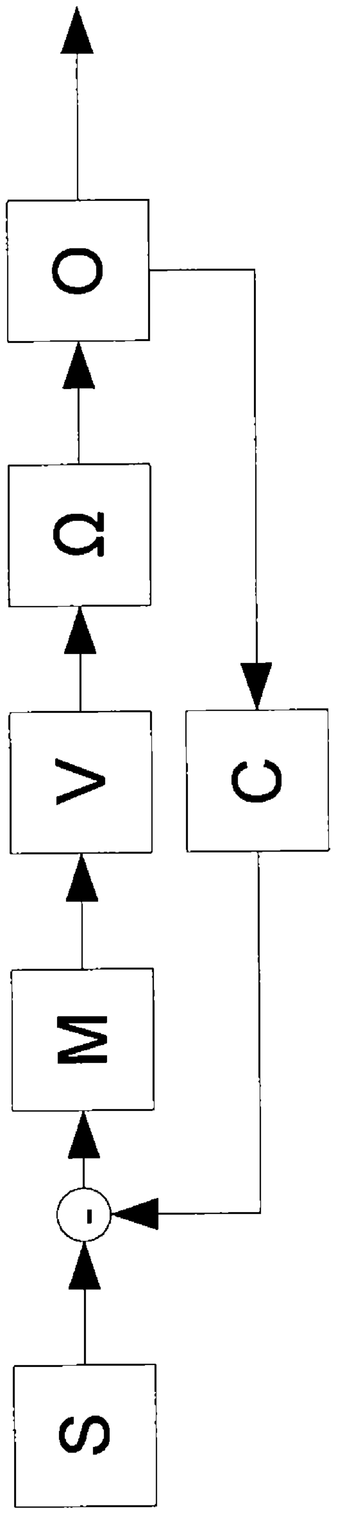
FIG. 3 is a block diagram for calculating the control signals of the system for compensating electromagnetic interfering fields.

The two vectors $\vec{S}_1$, and $\vec{S}_2$ are combined to a 6-vector $S=(S_1, S_2, S_3, S_4, S_5, S_6)$. S is processed by the control unit 7 according to the algorithm schematically shown in FIG. 3. In a first step, the six in total signals fed to the control unit 7 are converted into signals $V=(V_1, V_2, V_3, V_4, V_5, V_6)$ of a virtual sensor 5 (FIG. 1). This takes place by multiplying S by a 6×6 matrix M. Therefore, it is valid:

$$V=M\cdot S$$

The virtual signals V correspond to the amplitude of the interfering field at the location of the object 2 to be protected. Therefore M describes the geometry of the whole arrangement, and how the signals of the two real sensors 3, and 4 are combined.

The virtual signals V generated in such a manner are fed to independent control loops operating in parallel, and processed further. These control loops as part of the control unit 7 may be broadband, selective concerning a frequency range, or selective concerning a frequency. The control loops change the virtual signals V to modified signals $\hat{V}$. The transition from V to $\hat{V}$ is described by an operator Ω. Therefore, it applies:

$$\hat{V}=\Omega(V)$$

Since there are no limitations concerning the used control algorithms, the modification of the signals V is generally described by the operator Ω, which is not necessarily a matrix so that nonlinear algorithms may be used, also.

For gaining control signals for the coils 6, the modified signals $\hat{V}$ are converted into real control signals O. O again is a 6×1 matrix, therefore containing six single signals, which are used for controlling the six coils 6. The transition from the modified signals $\hat{V}$ to the control signals O is therefore described by $$O=L\cdot\hat{V}$$

or over all:

$$O=L\cdot\Omega(M\cdot S)$$

Here, L is a 6×6 matrix. The precise values of its elements depend on the nature of the interfering field to be compensated, and on the geometry of the coils 6 generating the compensation field. If, for example, a gradient field acting in x direction shall be compensated, the two coils acting in direction get differently strong signals so that the two coils generate differently high magnetic fields so that the compensation field also is a gradient field, whose direction of field intensity is inverse to the direction of the interfering field.

The algorithm described up to now is used as long as one single compensation system is only used. For this case, three virtual signals are needed, only. When doing so, virtual sensor positions are calculated, and gradient fields are generated. For this purpose, it is sufficient, if M is a 3×6 matrix, and L is a 6×3 matrix. Alternatively, the "not used" elements of the 6×6 matrices may also be equal to zero.

Figure 4:
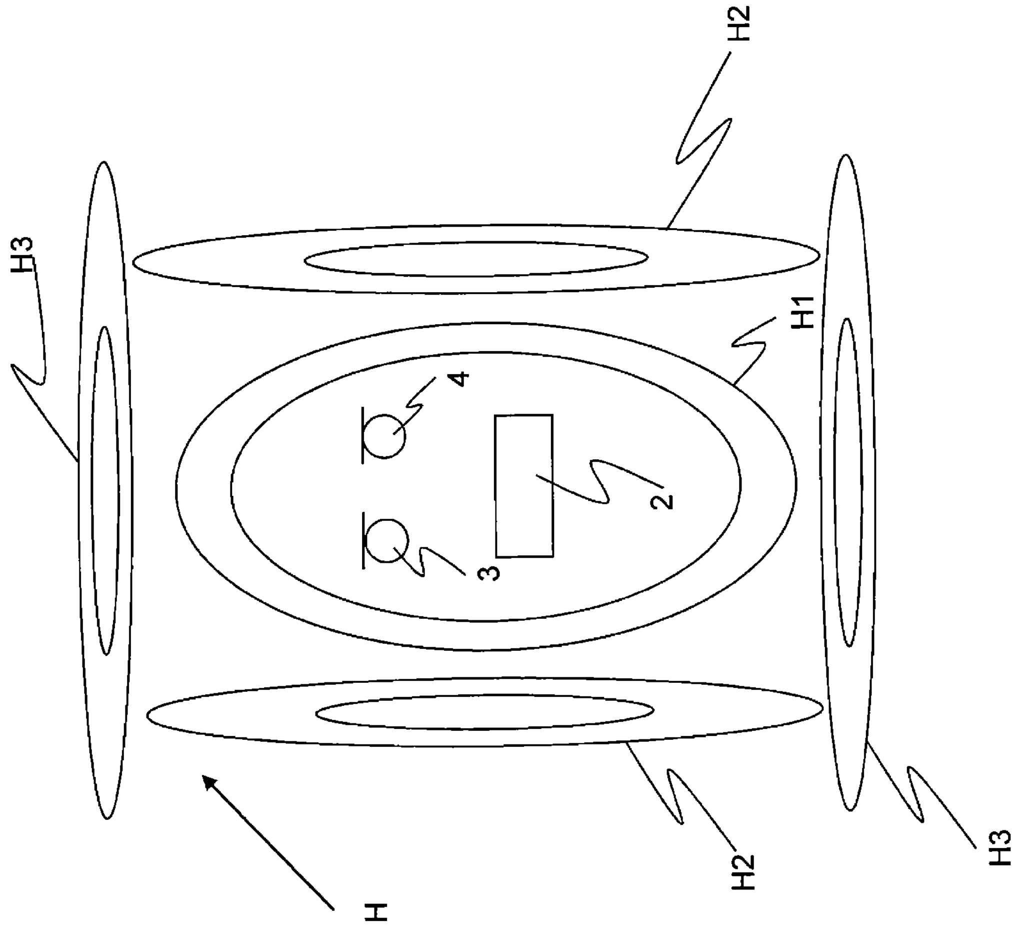
FIG. 4: is a schematic presentation of using the magnetic field compensation system.

Also, two compensation system being placed directly beside each other may be operated by means of the control unit 7. This can make sense, if two objects to be protected are directly placed beside each other, and shall, or may not be protected by a large compensation system. This implicates that, due to the two compensation systems being used, the regions to be protected have a significantly smaller volume. Therefore, no gradient fields are needed for compensation. With such an installation, generating gradient fields for compensation, however, is also not possible, because the six output signals of the control unit 7 are given to six pairs of coils, which are only able to generate a homogeneous magnetic field in each of the directions in space. The pairs of coils may be connected in series, in parallel, or depending on the impedance. These pairs of coils are each placed around the object 2 to be protected, and each of the corresponding systems is each arranged inside the cage formed by the three pairs of coils each. This configuration is shown in FIG. 4. Three pairs of Helmholtz coils H1, H2, H3 are arranged around the object 2 to be protected. The two real sensors 3, 4 are inside the one cage H.

Figure 5:
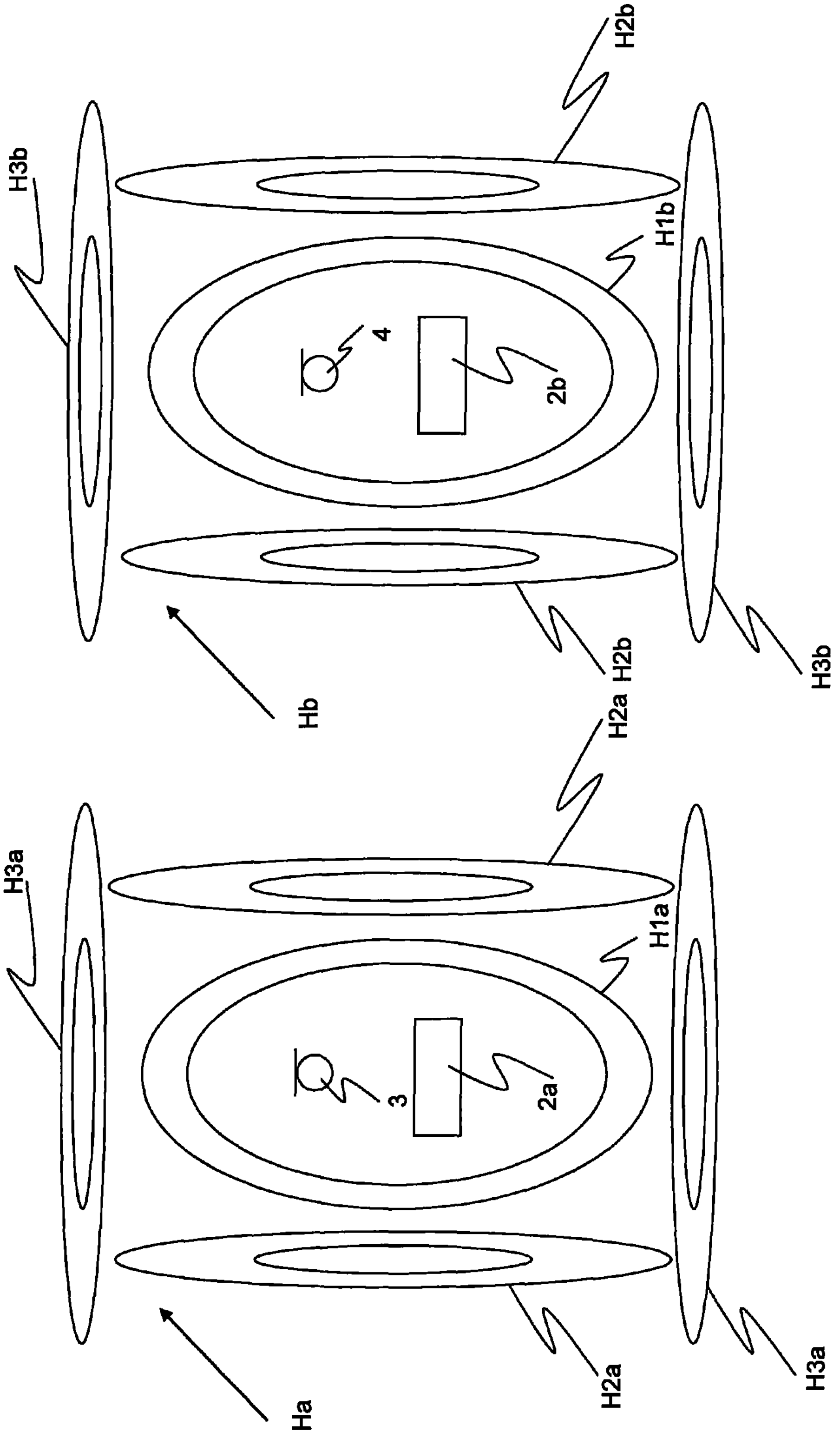
FIG. 5: is a schematic presentation of using two magnetic field compensation systems directly besides each other.

Two compensation systems may also be arranged directly beside each other. This case is shown in FIG. 5. Here, three pairs of Helmholtz coils H1*a*, H2*a*, H3*a*, or H1*b*, H2*b*, H3*b* respectively each form a cage Ha or Hb, respectively, One of the two real sensors 3, 4 is in each of the two cages Ha, Hb.

If two compensation systems are used in direct vicinity, feedback effects may arise between the two systems. This is accounted for by providing a 6×6 back coupling matrix C, which computationally eliminates the parts of the signals, which are crosstalks from an output signal $O_i$ to a virtual signal $V_i$. Therefore, C describes the kind of feedback between the two compensation systems installed directly beside each other.

According to the invention, the 6×1 matrix of the real sensor signals is expanded by the feedback part. If the 6×1 matrix of these expanded signals is denominated by $\hat{S}$, it applies $$\hat{S}=S-C\cdot O$$

The 6×1 matrix with the virtual sensor signals is calculated from the signals $\hat{S}$ expanded by the feedback part, obtained in this manner. Therefore, it applies:

$$V=M\cdot\hat{S}$$

finally yielding control signals according to the following relation:

$$O=L\cdot\Omega(M\cdot(S-C\cdot O))$$

In the following, a standard installation of the systems shall be assumed, i.e. only one system is installed. Therefore, no feedback effects occur, which means that the matrix C is equal to the zero matrix. Furthermore, it shall be assumed that the virtual sensor signal in x direction shall be composed of the arithmetic mean of the two real sensor signals in x direction, because the gradient of the interfering field proceeds in x direction. The virtual sensor signal in y direction shall be equal to the signal in y direction of the second real sensor, because, for example, the signal in y direction of the first real sensor contains unwanted components caused by a local interferer. Due to averaging/noise suppression reasons, the virtual sensor signal in z direction shall be equal to the arithmetic mean of the two real sensor signals in z direction. Under these assumptions, the matrix M has the following form:

$$M=\begin{pmatrix} 0,5 & 0 & 0 & 0,5 & 0 & 0 \\ 0 & 0 & 0 & 0 & 1 & 0 \\ 0 & 0 & 0,5 & 0 & 0 & 0,5 \\ 0 & 0 & 0 & 0 & 0 & 0 \\ 0 & 0 & 0 & 0 & 0 & 0 \\ 0 & 0 & 0 & 0 & 0 & 0 \end{pmatrix}$$

If the compensation coils are formed as pairs, and if a homogeneous compensation field shall be emitted in y, and in z direction, which field has a gradient in x direction, the matrix L has the following form:

$$L=\begin{pmatrix} 0,5 & 0 & 0 & 0 & 0 & 0 \\ 0 & 1 & 0 & 0 & 0 & 0 \\ 0 & 0 & 1 & 0 & 0 & 0 \\ 1 & 0 & 0 & 0 & 0 & 0 \\ 0 & 1 & 0 & 0 & 0 & 0 \\ 0 & 0 & 1 & 0 & 0 & 0 \end{pmatrix}$$

A double installation is considered in the following example, i.e., two systems for compensating electromagnetic fields are operated directly beside each other.

Since the output signals for both compensation cages are known inside the control unit 7 in this case, now also feedback parts can be taken into consideration in the control structure. This takes place, as already is described, by using a feedback, or crosscoupling matrix C. This matrix C or its elements, respectively, may experimentally be determined in a comparably easy manner, by applying a signal to an output of the first compensation system, and measuring at the second system, which components are absorbed by the sensors of the second system, and which fraction of the amplitude, in comparison with the sensor of the first system. Then, these signals parts are the elements of the feedback matrix C. When doing so, this measuring method has to be done for all coils.

If, for example, the output $O_5$ still radiates onto the sensor input $S_s$ with 40%, the matrix element has to be $C_{25}=0.4$.

What is claimed is:

1. A system for compensating electromagnetic interfering fields of objects to be protected, comprising:

two triaxial magnetic field sensors configured to output real sensor signals (S);

six compensation coils arranged as a cage around the object to be protected and actuated individually; and a control unit with control loops, the control unit having a digital processor, six inputs, and six outputs, the digital processor receives the real sensor signals (S) at the six inputs and processes the real sensor signals into real control signals (O) for the six compensation coils, wherein the real sensor signals (S) are converted to virtual sensor signals (V) by a first matrix multiplication to map interfering fields at a location of the object, whereupon the virtual sensor signals are made to modified signals ($\hat{V}$) by the control loops, wherein the transition from the virtual sensor signals (V) to the modified signals ($\hat{V}$) is described by multiplication of the virtual sensor signals (V) with a matrix ($\Omega$) such that $\hat{V}=\Omega\cdot V$, wherein the modified signals ($\hat{V}$) are converted to the real control signals (O) by a second matrix multiplication, the real control signals (O) being individually fed to the six compensation coils at the six outputs.

2. The system according to claim 1, wherein the six outputs of the control unit each are connected with pairs of coils, wherein one of the two triaxial magnetic field sensors is allocated to a first of the objects and wherein the real control signals (O) are multiplied by a feedback matrix (C) describing how the objects influence each other to result in a feedback part, wherein the feedback part is subtracted from the real sensor signals, resulting in expanded signals ($\hat{S}$), such that $\hat{S}=S-C\cdot O$.

* * * * *